(12) United States Patent
Inoue

(10) Patent No.: US 7,071,795 B2
(45) Date of Patent: Jul. 4, 2006

(54) FILM BULK ACOUSTIC WAVE RESONATOR WAFER AND METHOD OF FABRICATING A FILM BULK ACOUSTIC WAVE RESONATOR

(75) Inventor: Kenji Inoue, Tokyo (JP)

(73) Assignee: TDK Corporation (JP)

( * ) Notice: Subject to any disclaimer, the term of this patent is extended or adjusted under 35 U.S.C. 154(b) by 108 days.

(21) Appl. No.: 10/980,207

(22) Filed: Nov. 2, 2004

(65) Prior Publication Data

US 2005/0104689 A1    May 19, 2005

(30) Foreign Application Priority Data

Nov. 13, 2003   (JP)   ............... 2003-383290

(51) Int. Cl.
*H03H 9/15*     (2006.01)
*H03H 3/02*     (2006.01)

(52) U.S. Cl. .............. 333/187; 333/189; 29/25.35

(58) Field of Classification Search ........... 333/187, 333/189; 29/25.35
See application file for complete search history.

(56) References Cited

U.S. PATENT DOCUMENTS 6,894,360 B1 *   5/2005   Bradley .............. 257/458

FOREIGN PATENT DOCUMENTS

JP       56-129759       2/1983

* cited by examiner

*Primary Examiner*—Barbara Summons
(74) *Attorney, Agent, or Firm*—Young Law Firm, P.C.

(57) ABSTRACT

A film bulk acoustic wave resonator wafer of the present invention prevents electric discharge from occurring in the process of fabricating a film bulk acoustic wave resonator, thereby enhancing product reliability and yield. The film bulk acoustic wave resonator wafer of the present invention comprises a substrate, a lower electrode and an upper electrode provided on the substrate and a piezoelectric film provided between the lower electrode and upper electrode. The lower electrode and upper electrode are shorted through a window provided in the piezoelectric film. Since the lower electrode and upper electrode are therefore kept at the same potential, no electric discharge passing through the piezoelectric film occurs even during the formation of a protective film covering the upper electrode, dicing of the substrate and other processes in which discharge has heretofore been likely to occur.

10 Claims, 8 Drawing Sheets

FILM BULK ACOUSTIC WAVE RESONATOR WAFER AND METHOD OF FABRICATING A FILM BULK ACOUSTIC WAVE RESONATOR

TECHNICAL FIELD

The present invention relates to a film bulk acoustic wave resonator wafer, and particularly to a film bulk acoustic wave resonator wafer for obtaining film bulk acoustic wave resonators in large numbers. The present invention also relates to a method of fabricating a film bulk acoustic wave resonator, and particularly to a method of fabricating a film bulk acoustic wave resonator that enables multiple film bulk acoustic wave resonators to be obtained.

BACKGROUND OF THE INVENTION

Numerous types of small, high-performance resonators utilizing piezoelectric materials have been put into practical use, such as the film bulk acoustic wave resonator (FBAR) and the surface acoustic wave (SAW) resonator. The film bulk acoustic wave resonator has recently drawn particular attention with regard to applications requiring high resonant frequencies of, for instance, 5 GHz and higher, because it is structurally easier to increase in resonant frequency than the surface acoustic wave resonator.

The film bulk acoustic wave resonator basically consists of an upper electrode, a lower electrode and a piezoelectric film between the two electrodes. The desired resonance characteristics can be obtained by applying high-frequency signal between the upper and lower electrodes. The resonant frequency of a film bulk acoustic wave resonator depends mainly on the thicknesses of the upper electrode, lower electrode and piezoelectric film. These thicknesses are set with reference to the wavelength determined by the ratio of the acoustic velocity of the bulk wave to the resonant frequency (acoustic velocity/resonant frequency). The acoustic velocity of the bulk wave is determined by the physical properties of the materials constituting the respective films (their elastic constants etc.), so that the wavelengths of the respective films become shorter as the resonant frequency is set higher. In other words, the thickness of the piezoelectric film and other films has to be made thinner to achieve a higher resonant frequency.

Therefore, where a high resonant frequency of 5 GHz or higher is desired, the thickness of the piezoelectric film must be made very thin. When the ZnO is used as the material of the piezoelectric film, for example, the thickness of the film must be made about 0.27 μm to realize a resonant frequency of 5 GHz or higher.

Owing to the fact that the piezoelectric film exhibits pyroelectricity, however, a potential difference is liable to arise between the upper electrode and lower electrode in the course of film bulk acoustic wave resonator fabrication. When this potential difference becomes large, electric discharge occurs between the upper and lower electrodes. Since this discharge passes through the interposed piezoelectric film, it may damage the piezoelectric film and thus lower the reliability and yield of the product. Moreover, the likelihood of such discharge increases with decreasing piezoelectric film thickness, so that it is a particularly serious problem in the case of fabricating a film bulk acoustic wave resonator having a high resonant frequency of 5 GHz or higher.

SUMMARY OF THE INVENTION

It is therefore an object of the present invention to prevent electric discharge from occurring in the process of fabricating a film bulk acoustic wave resonator, thereby enhancing product reliability and yield.

The above and other objects of the present invention can be accomplished by a film bulk acoustic wave resonator wafer employing a plurality of film bulk acoustic wave resonator forming regions, comprising:
a substrate;
a lower electrode and an upper electrode provided on the substrate; and
a piezoelectric film provided between the lower electrode and upper electrode,
wherein the lower electrode and upper electrode are shorted at least a part of region located between the film bulk acoustic wave resonator forming regions.

Owing to the shorting of the lower electrode and upper electrode among at least some of the film bulk acoustic wave resonator forming regions in accordance with the present invention, the lower electrode and upper electrode assume the same potential. As a result, electric discharge through the piezoelectric film does not occur even during formation of a protective film covering the upper electrode, substrate dicing and other processes in which discharge has heretofore been likely to occur.

Preferably, each of the lower electrode and upper electrode includes a shorting electrode portion surrounding the peripheries of the film bulk acoustic wave resonator forming regions, and the planar positions of at least a part of the shorting electrode portion of the lower electrode and at least a part of the shorting electrode portion of the upper electrode substantially coincide. This configuration enables shorting of the lower electrode and upper electrode to be readily achieved. A window portion where the piezoelectric film is not present can be formed between the shorting electrode portion of the lower electrode and the shorting electrode portion of the upper electrode either continuously or discontinuously. In either case, the lower electrode and upper electrode are shorted through the window portion.

An acoustic multilayer film is preferably further provided between the substrate and lower electrode. This configuration makes it possible to improve the characteristics of the fabricated film bulk acoustic wave resonators.

The method of fabricating a film bulk acoustic wave resonator according to the present invention comprises a first step of forming a lower electrode on a substrate, a second step of forming on the lower electrode a piezoelectric film having a window portion that exposes a part of the lower electrode, a third step of forming an upper electrode on the piezoelectric film so as to be shorted to the lower electrode through the window portion, and a fourth step of cutting the substrate along the window portion.

In this aspect of the invention, the lower electrode and lower electrode are shorted through the window portion, so that electric discharge through the piezoelectric film does not occur. Since the substrate is cut along the window portion, moreover, the lower electrode and upper electrode can be separated by the cutting.

In the second step, the piezoelectric film is preferably formed while the portion to become the window portion is masked. This enables the lower electrode and upper electrode to be shorted without addition of any special fabrication process.

Thus, in the present invention the lower electrode and upper electrode remain at the same potential during the fabrication process so that no electric discharge passing through the piezoelectric film occurs. As a result, not only high reliability but also high product yield can be achieved even when fabricating a film bulk acoustic wave resonator formed with a very thin piezoelectric film so as to have a high resonant frequency of, for example, 5 GHz or higher.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1A:
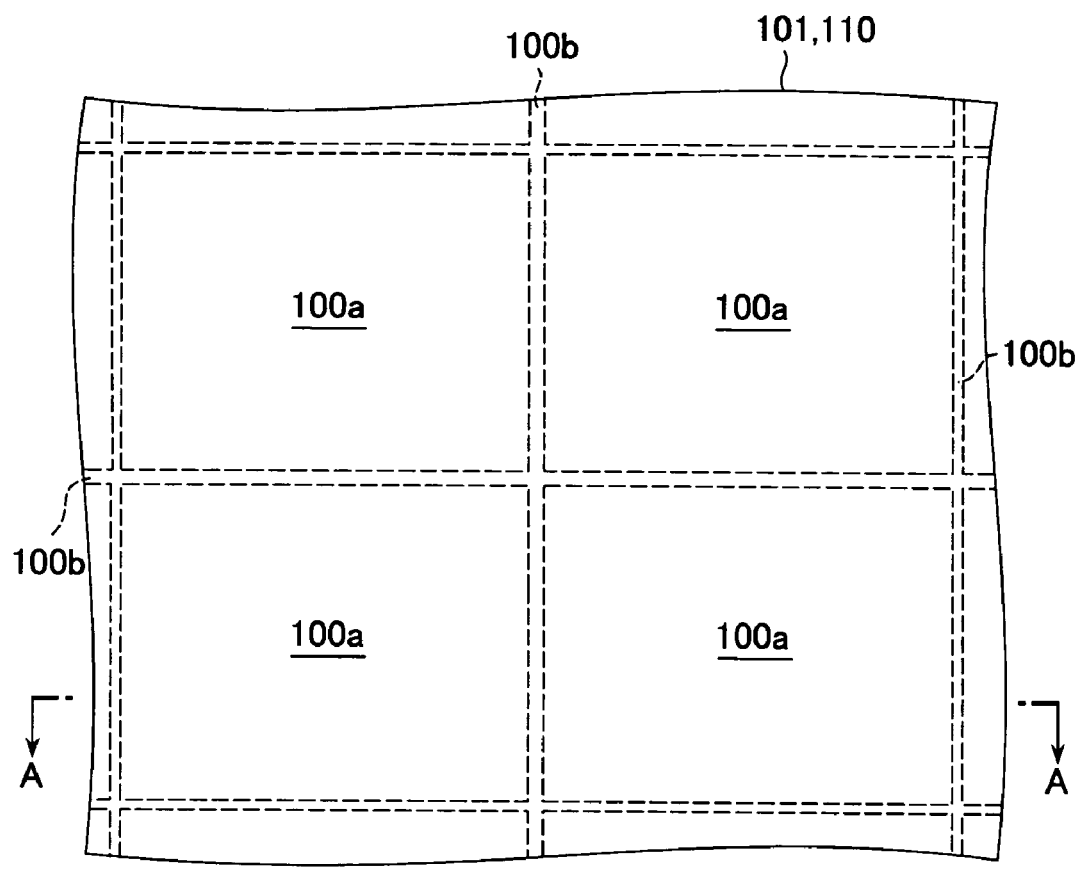
FIG. 1A is a schematic plan view showing a step (formation of an acoustic multilayer film 110) in a film bulk acoustic wave resonator fabrication method that is a preferred embodiment of the present invention.
Figure 2A:
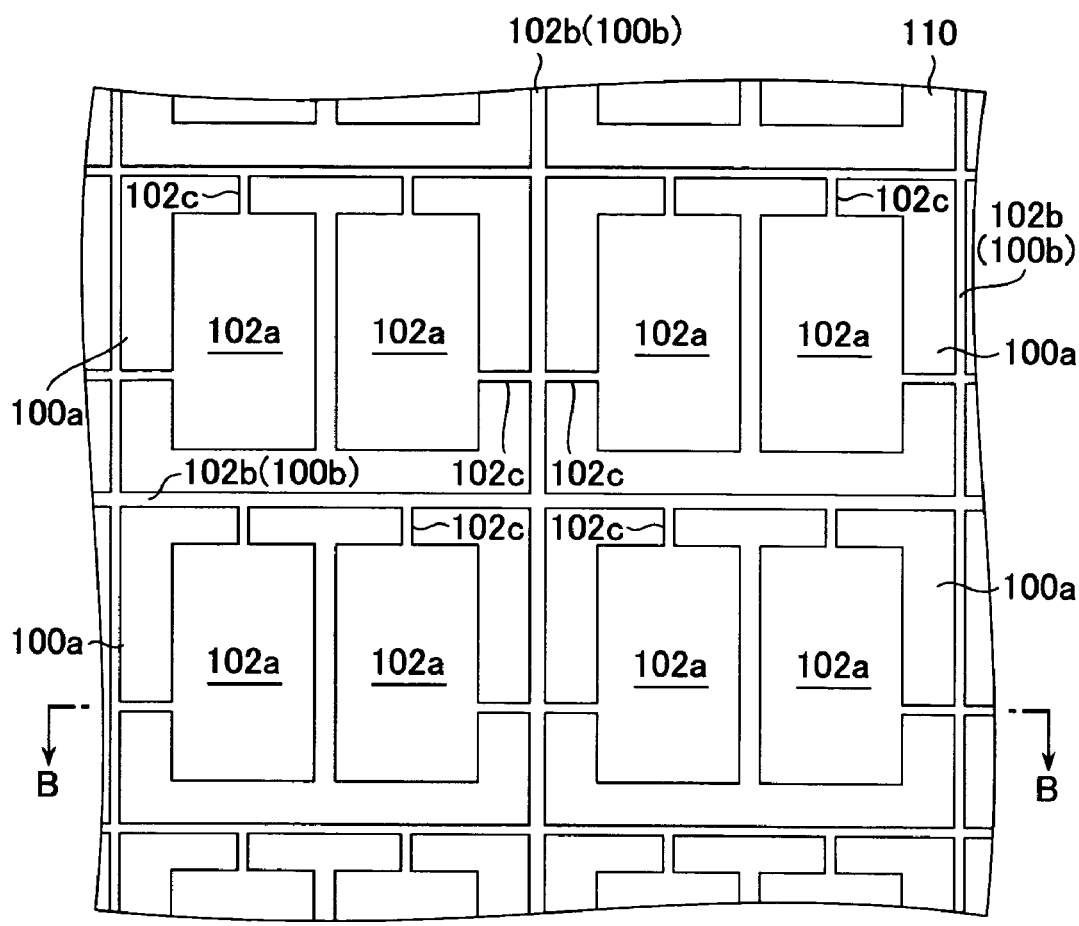
FIG. 2A is a schematic plan view showing a step (formation of a lower electrode 102) in a film bulk acoustic wave resonator fabrication method that is a preferred embodiment of the present invention.
Figure 2B:
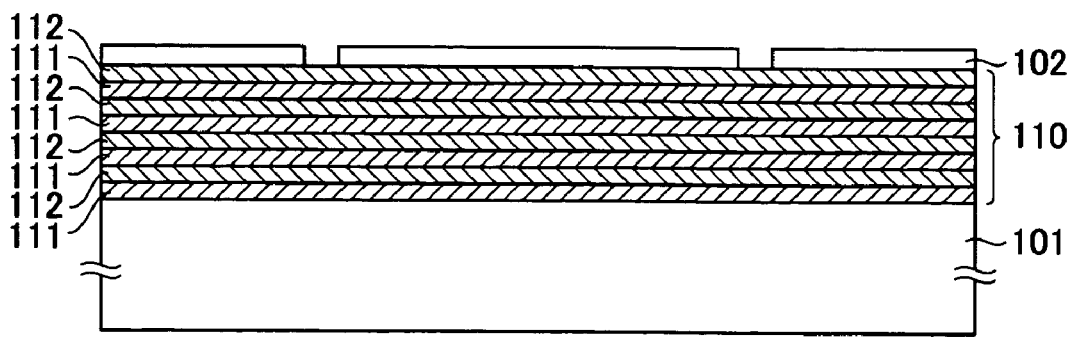
FIG. 2B is a schematic sectional view taken along line B—B in FIG. 2A.
Figure 3A:
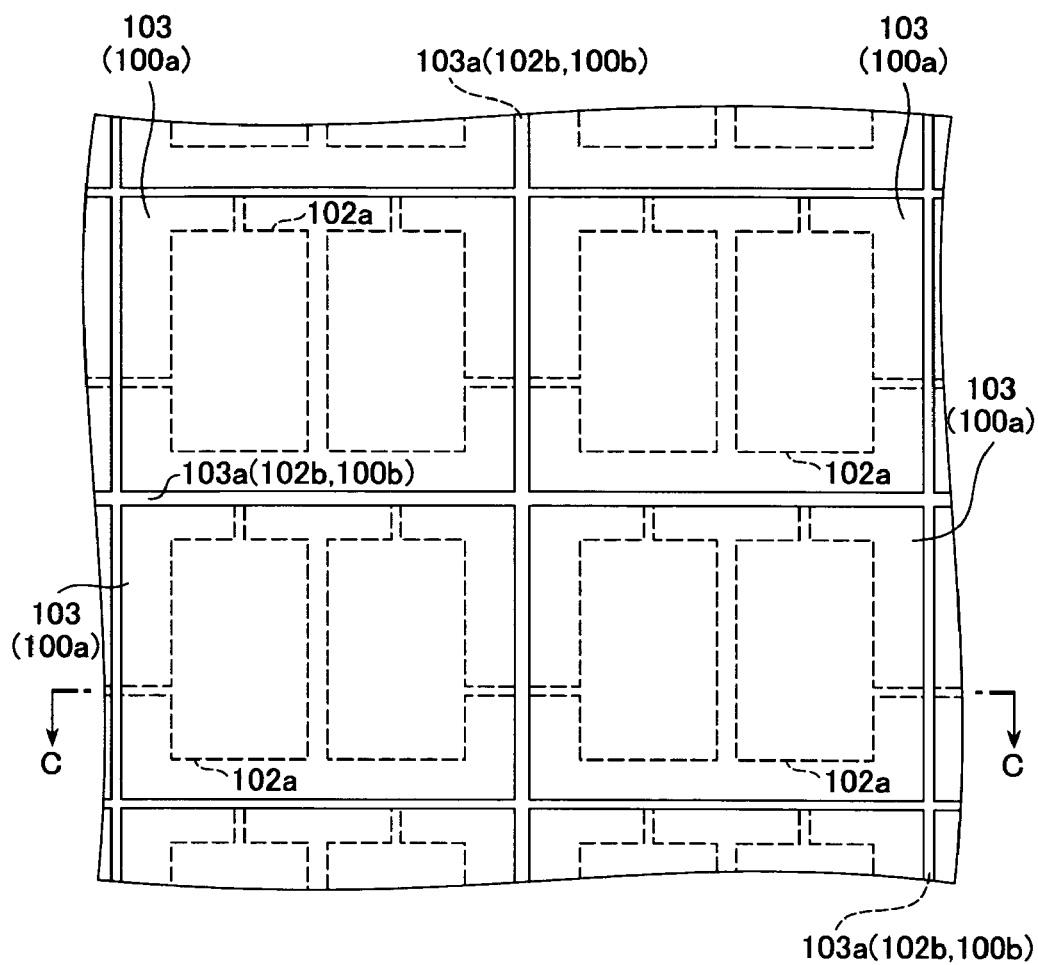
FIG. 3A is a schematic plan view showing a step (formation of a piezoelectric film 103) in a film bulk acoustic wave resonator fabrication method that is a preferred embodiment of the present invention.
Figure 3B:
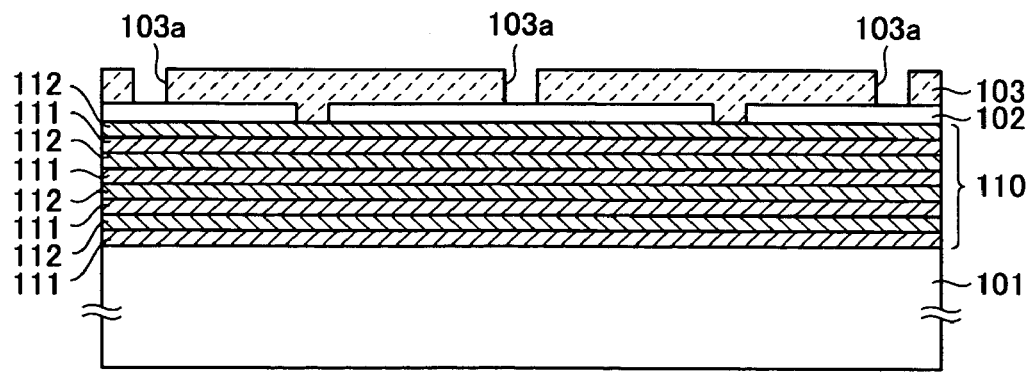
FIG. 3B is a schematic sectional view taken along line C—C in FIG. 3A.
Figure 4:
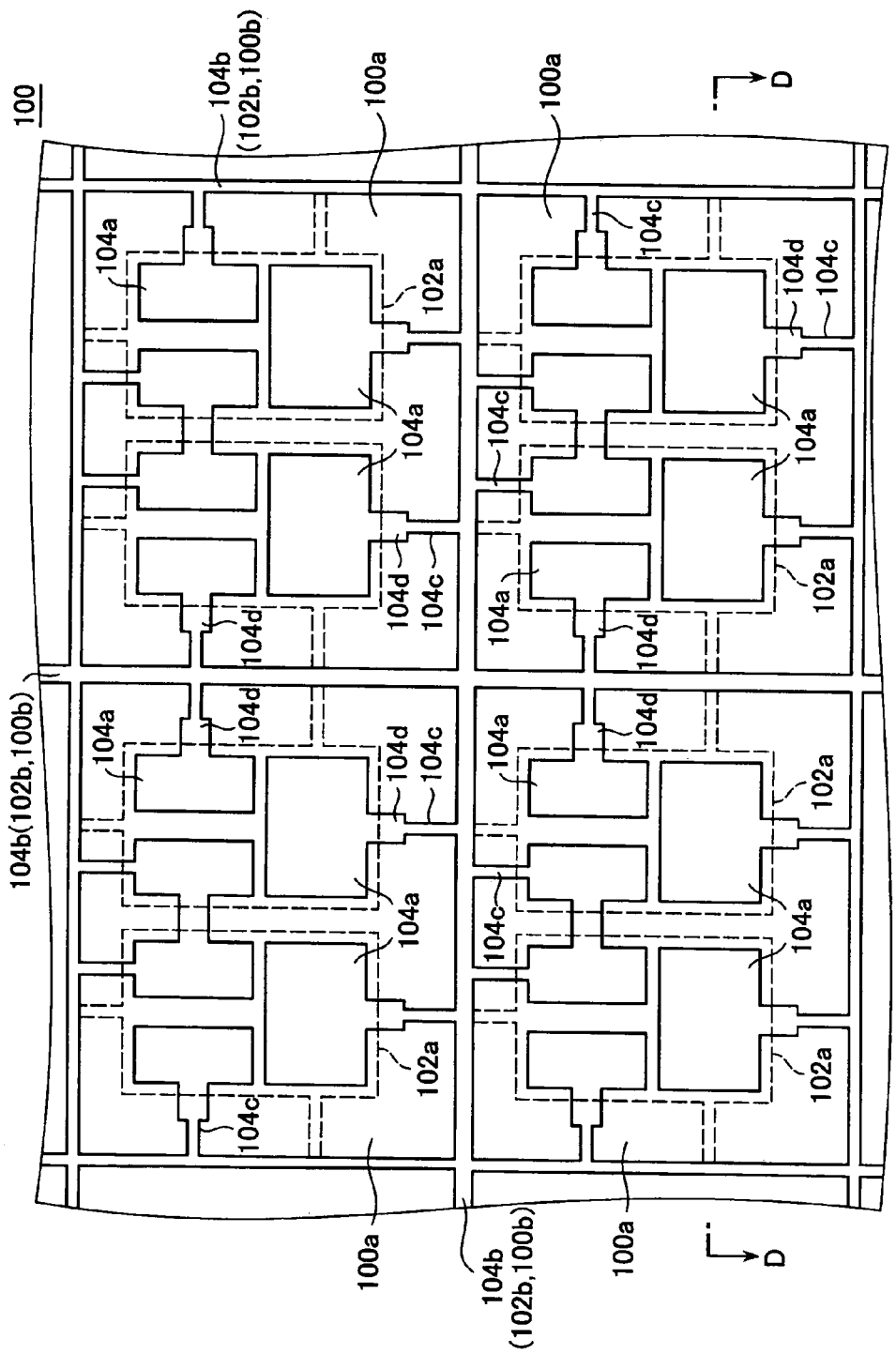
FIG. 4 is a schematic plan view showing a step (formation of an upper electrode 104) in a film bulk acoustic wave resonator fabrication method that is a preferred embodiment of the present invention.
Figure 5:
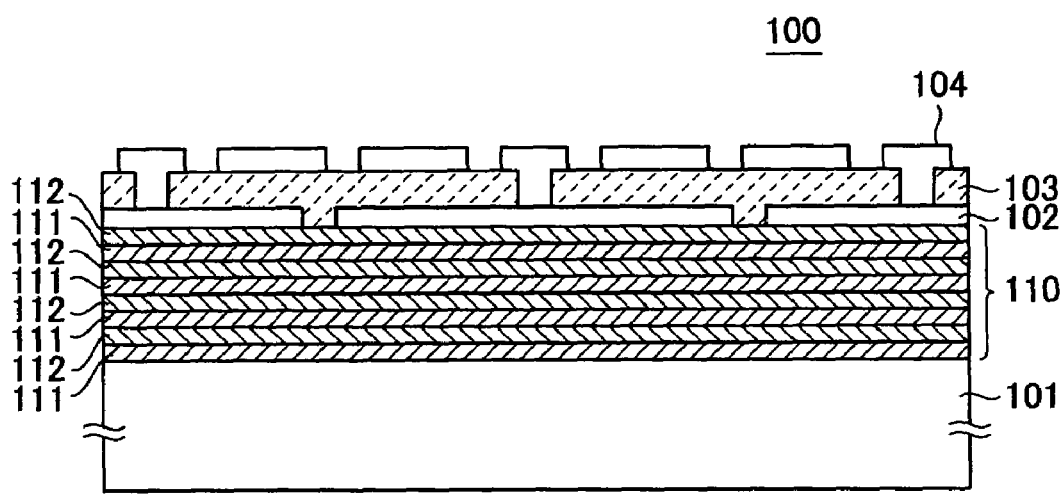
FIG. 5 is a schematic sectional view taken along line D—D in FIG. 4.

FIGS. 1A to 5 are process drawings showing a method of fabricating a film bulk acoustic wave resonator that is a preferred embodiment of the present invention. Specifically, FIGS. 1A, 2A and 3A are schematic plan views and FIGS. 1B, 2B and 3B are schematic sectional views taken along line A—A, line B—B and line C—C, respectively. FIG. 4 is a schematic plan view and FIG. 5 is a schematic sectional view taken along line D—D in FIG. 4.

Figure 1B:
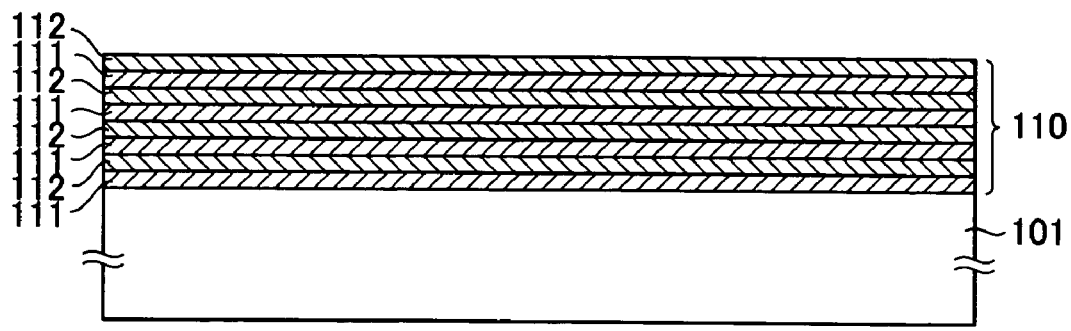
FIG. 1B is a schematic sectional view taken along line A—A in FIG. 1A.

Although, as shown in FIGS. 1A and 1B, the fabrication of the film bulk acoustic wave resonator according to this embodiment is carried out simultaneously with respect to a plurality of film bulk acoustic wave resonators, the ensuing description will in the interest of simplicity sometimes focus on a single film bulk acoustic wave resonator. The fabrication starts with making ready a substrate 101 of prescribed area and forming an acoustic multilayer film 110 on one of its major surfaces. The substrate 101 and the layers formed thereon are divided in the planar direction into a number of film bulk acoustic wave resonator forming regions 100a and dicing regions 100b that are present in a grid-like pattern among the film bulk acoustic wave resonator forming regions 100a. The dicing regions 100b are regions that are to be diced so as to separate the film bulk acoustic wave resonator forming regions 100a into individual film bulk acoustic wave resonators. The width of the dicing regions 100b is set to be narrower than the "cutting allowance" at the time of dicing. The significance of this will be explained later.

The substrate 101 serves as a base for ensuring the required mechanical strength of the film bulk acoustic wave resonator. The substrate 101 can, for example, be a silicon (Si), sapphire or other such single crystal substrate, alumina, AlTiC or other ceramic substrate, quartz or glass substrate. Among these, Si single crystal is most preferably used because it is an inexpensive material for which sophisticated wafer processing technologies are available.

The acoustic multilayer film 110 has a structure obtained by alternately overlaying reflective films 111 and 112 made of different materials. It serves to enhance the characteristics of the film bulk acoustic wave resonator by reflecting vibration propagating in the direction of the substrate 101. The number of reflective films constituting the acoustic multilayer film 110 is not particularly defined. In this embodiment, it is composed of four layer pairs each consisting of a reflective film 111 and a reflective film 112. The materials of the reflective films 111 and 112 are not particularly defined other than for the requirement that the reflective film 111 must have higher acoustic impedance than the reflective film 112.

However, the reflective film 111, which is the one of the paired reflective films 111 and 112 located on the side of the substrate 101, is preferably made of aluminum nitride (AlN), while the reflective film 112, which is located on the side of a lower electrode 102 (see FIG. 2B), is preferably made of silicon oxide ($SiO_2$). When aluminum nitride (AlN) is used as the material of the reflective film 111, the reflective film 111 is preferably formed by sputtering. When silicon oxide ($SiO_2$) is used as the material of the reflective film 112, the reflective film 112 is preferably formed by CVD (chemical vapor deposition). The thicknesses of the reflective films 111 and 112 can be decided based on the desired resonant frequency and are each preferably set at about ¼ of the wavelength. The wavelength is defined as the ratio of the acoustic velocity of the bulk wave to the resonant frequency (acoustic velocity/resonant frequency).

Next, as shown in FIGS. 2A and 2B, the surface of the acoustic multilayer film 110 is formed with a conductive film that is patterned to form the lower electrode 102 (first step).

As shown in FIG. 2A, in each film bulk acoustic wave resonator forming region 100a, the lower electrode 102 comprises electrode body portions 102a formed on the film bulk acoustic wave resonator forming region 100a, a grid-like shorting electrode portion 102b formed on the dicing region 100b, and connecting portions 102c that connect the electrode body portions 102a and the shorting electrode portion 102b. This configuration interconnects the electrode body portions 102a and the shorting electrode portion 102b through the connecting portions 102c. This embodiment represents a case in which each film bulk acoustic wave resonator forming region 100a is formed internally with two electrode body portions 102a.

The lower electrode 102 having this planar configuration can be produced by first forming a conductive film over the whole surface of the acoustic multilayer film 110 by use of vacuum deposition, sputtering, CVD or the like, then forming a resist layer in a prescribed pattern on the surface of the conductive film, and thereafter using the patterned resist as a mask for patterning the conductive film by means of an etching process such as ion milling. The electrode body portions 102a of the lower electrode 102 serve as one electrode of the film bulk acoustic wave resonator. On the other hand, they also serve as the base film upon which a piezoelectric film is formed in the next step. When the material used to form the piezoelectric film is a piezoelectric material of wurtzite crystal structure such as AlN, ZnO, GaN or the like, the lower electrode 102 is preferably a metallic film oriented in the (111) plane of the face-centered cubic structure or the (0001) plane of the hexagonal close-packed structure. This is because piezoelectric material of excellent crystallinity can be epitaxially grown on the lower electrode 102 when the lower electrode 102 is formed of a metallic film oriented in the (111) plane of the face-centered cubic structure or a metallic film oriented in the (0001) plane of the hexagonal close-packed structure.

The material of the lower electrode 102 is preferably composed primarily of at least one among platinum (Pt), gold (Au), iridium (Ir), osmium (Os), rhenium (Re), palladium (Pd), rhodium (Rh) and ruthenium (Ru). Platinum (Pt), gold (Au), iridium (Ir), palladium (Pd) and rhodium (Rh) assume face-centered cubic structure, while osmium (Os), rhenium (Re) and ruthenium (Ru) assume hexagonal close-packed structure. These metals are advantageous in that their surfaces are easy to keep clean and if fouled can be readily made clean by ashing, heat treatment or the like. A clean lower electrode 102 surface enables the next formed piezoelectric film to be easily formed to have good crystallinity.

The lower electrode 102 can alternatively be formed of, for instance, a face-centered cubic structure metallic film of molybdenum (Mo), tungsten (W) or the like or of a perovskite structure oxide conductor film such as $SrRuO_3$.

The thickness of the lower electrode 102 can be decided based on the desired resonant frequency and is preferably set at about 1/10 the wavelength.

An adhesive layer is preferably interposed between the lower electrode 102 and acoustic multilayer film 110 so as to improve the adhesion between the two. The adhesive layer is best constituted of a crystal having wurtzite crystal structure. It is preferably made of a nitrogen compound of at least one element selected from among Group III elements such as aluminum (Al), gallium (Ga) and indium (In) or of an oxide of a Group II element such as beryllium (Be) or zinc (Zn). AlN is the most preferable material for the adhesive layer because it is stable in air and can be readily formed into a film exhibiting high crystallinity by reactive sputtering.

Next, as shown in FIGS. 3A and 3B, a piezoelectric film 103 is formed on the film bulk acoustic wave resonator every forming region 100a (second step). This step is conducted so as not to form the piezoelectric film 103 on at least a part of the dicing regions 100b (no part of the dicing regions in this embodiment), thereby leaving windows 103a through which the shorting electrode portions 102b of the lower electrode 102 are exposed.

The piezoelectric film 103 having this planar configuration is most preferably produced by selectively forming it through a grid-like mask covering the dicing regions 100b, by vacuum deposition, sputtering, CVD or the like. However, it is alternatively possible to form the piezoelectric film 103 over the whole surface of the substrate 101 formed with the acoustic multilayer film 110 and lower electrode 102, cover the film bulk acoustic wave resonator forming regions 100a with resist, and pattern the piezoelectric film 103 by means of an etching process such as ion milling using the resist as a mask. It should be noted, however, that the first-mention method (of selectively forming the piezoelectric film 103 using a grid-like mask) is advantageous in the point that it involves fewer processing steps.

As pointed out earlier, the piezoelectric film 103 can be formed of a piezoelectric film material of wurtzite crystal structure such as AlN, ZnO, GaN or the like. When AlN, ZnO or other such piezoelectric material having wurtzite crystal structure is used for the piezoelectric film 103, it is preferably formed by a sputtering method such as RF magnetron sputtering, DC sputtering or ECR sputtering or by CVD (chemical vapor deposition), MBE (molecular beam epitaxy) or vacuum deposition. Use of a sputtering method is preferable and RF magnetron sputtering is particularly preferable. This is because RF magnetron sputtering enables ready formation of a high-crystallinity film composed of AlN or ZnO that is single oriented in the direction of the c axis direction. When AlN is used, it is preferable to utilize reactive RF magnetron sputtering. In this case, it is possible to fabricate an excellent AlN film by using Al metal as the cathode, introducing Ar or nitrogen gas and conducting reactive RF magnetron sputtering at a substrate temperature of around 200° C. A high-crystallinity film that is very low in impurities can also be fabricated using ECR sputtering.

The thicknesses of the piezoelectric film 103 can also be decided based on the desired resonant frequency and is preferably set at about 1/2 of the wavelength.

It should be noted that when an insulating film of $SiO_2$ or the like is formed on the piezoelectric film 103 in order to improve the temperature characteristics, for example, it is also in this case necessary to expose the shorting electrode portions 102b of the lower electrode 102 at the windows 103a. An insulating film of this type is also preferably selectively formed through a grid-like mask covering the windows 103a, by vacuum deposition, sputtering, CVD or the like. Although it is of course also possible to form the insulating film throughout and thereafter form the windows 103a by patterning, selective formation of the insulating film using a grid-like mask involves fewer processing steps.

Next, as illustrated in FIGS. 4 and 5, the substrate 101 provided with the piezoelectric film 103 and other layers is formed throughout with a conductive film which is then patterned to form upper electrodes 104 (third step).

As shown in FIG. 4, each upper electrode 104 comprise electrode body portions 104a formed above the electrode body portions 102a of the lower electrodes 102, shorting electrode portions 104b formed in a grid-like pattern on the dicing regions 100b, connecting portions 104c that connect the electrode body portions 104a and shorting electrode portions 104b, and terminal portions 104d that later come to constitute an electrode pad. This configuration interconnects the electrode body portions 104a and the shorting electrode portions 104b through the connecting portions 104c. This embodiment represents a case in which three electrode body portions 104a are provided above each electrode body portion 102a of the lower electrode 102. The grid-like shorting electrode portions 104b of the upper electrode 104 are provided at the dicing regions 100b and therefore coincide in planar location with the shorting electrode portions 102b of the lower electrode 102. As a result, the shorting electrode portions 102b of the lower electrode 102 and the shorting electrode portions 104b of the upper electrode 104 are shorted through the windows 103a.

The upper electrode 104 having this planar configuration can be produced by first forming a conductive film over the whole surface of the substrate 101 formed with the piezoelectric film 103, by use of vacuum deposition, sputtering, CVD or the like, then forming a resist layer in a prescribed pattern on the surface of the conductive film, and thereafter using the patterned resist as a mask for patterning the conductive film by means of an etching process such as ion milling. When the aforesaid insulating film is formed on the piezoelectric film 103, it can be used as an etching stopper.

The material of the upper electrode 104 is required to have high electrical conductivity but is not otherwise particularly limited. It can be a metal such as aluminum (Al), gold (Au) or platinum (Pt), an alloy of any of these metals and copper (Cu) or the like, or a multilayer film obtained by laminating any of these metals and a metal such as titanium (Ti). The thicknesses of the upper electrode 104 can also be decided based on the desired resonant frequency and is preferably set at about 1/10 of the wavelength.

The foregoing steps complete the fabrication of a film bulk acoustic wave resonator wafer 100 from which can be obtained a number of the film bulk acoustic wave resonators described in the foregoing. As explained earlier, the film bulk acoustic wave resonator wafer 100 is constituted such that the shorting electrode portions 102b of the lower electrodes 102 and the grid-like shorting electrode portions 104b of the upper electrodes 104 are shorted through the continuous windows 103a provided in the piezoelectric film 103. The lower electrodes 102 and upper electrodes 104 are therefore reliably kept at the same potential. This eliminates any risk of electrical discharge occurring between the lower electrodes 102 and upper electrodes 104 in an ensuing processing step.

After the upper electrodes 104 have been formed in the foregoing manner, a protective film or the like is formed to cover the upper electrodes 104 and, in the final step, the substrate 101 is diced along the dicing regions 10b, i.e., along the windows 103a, to separate the film bulk acoustic wave resonator wafer 100 into the individual film bulk acoustic wave resonator forming regions 100a, which are collected as discrete film bulk acoustic wave resonators (fourth step). As mentioned earlier, the width of the dicing regions 100b is set to be narrower than the "cutting allowance." The dicing of the substrate 101 along the dicing regions 100b therefore completely eliminates the shorting electrode portions 102b of the lower electrodes 102 and the shorting electrode portions 104b of the upper electrode 104. As a result, the electrode body portions 102a of the lower electrodes 102 and the electrode body portions 104a of the upper electrodes 104 are completely separated. This completes the fabrication of the film bulk acoustic wave resonators.

As explained in the foregoing, the formation of the protective film covering the upper electrodes 104, the dicing of the substrate 101 and other production processes conducted in the course of fabricating the film bulk acoustic wave resonator are carried out with the lower electrodes 102 and the upper electrodes 104 in a shorted state, so that no electric discharge passing through the piezoelectric film occurs in the course of fabrication. As a result, not only high reliability but also high product yield can be achieved even when fabricating a film bulk acoustic wave resonator formed with a very thin piezoelectric film 103 so as to have a high resonant frequency of 5 GHz or higher.

Figure 6:
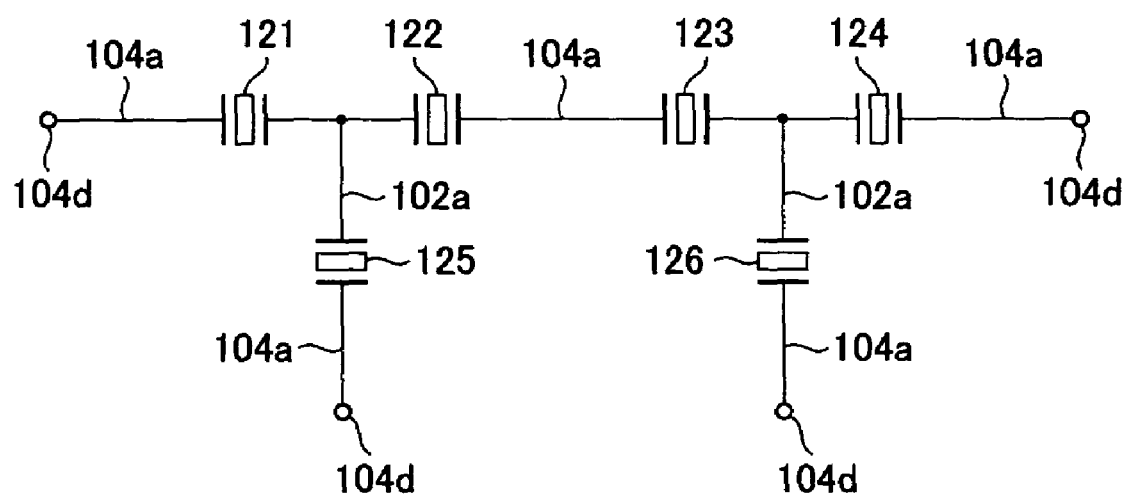
FIG. 6 is an equivalent circuit diagram of a film bulk acoustic wave resonator fabricated in accordance with a preferred embodiment of the present invention.

FIG. 6 is an equivalent circuit diagram of a film bulk acoustic wave resonator fabricated in accordance with the foregoing processing steps.

As shown in FIG. 6, the fabricated film bulk acoustic wave resonator has a two-stage T-circuit configuration consisting of four resonators 121 to 124 connected in series and two resonators 125 and 126 connected in parallel. It can be utilized as a filter by connecting an inductance or the like to the terminal portion 104d.

The present invention is in no way limited to the aforementioned embodiments, but rather various modifications are possible within the scope of the invention as recited in the claims, and naturally these modifications are included within the scope of the invention.

Figure 7:
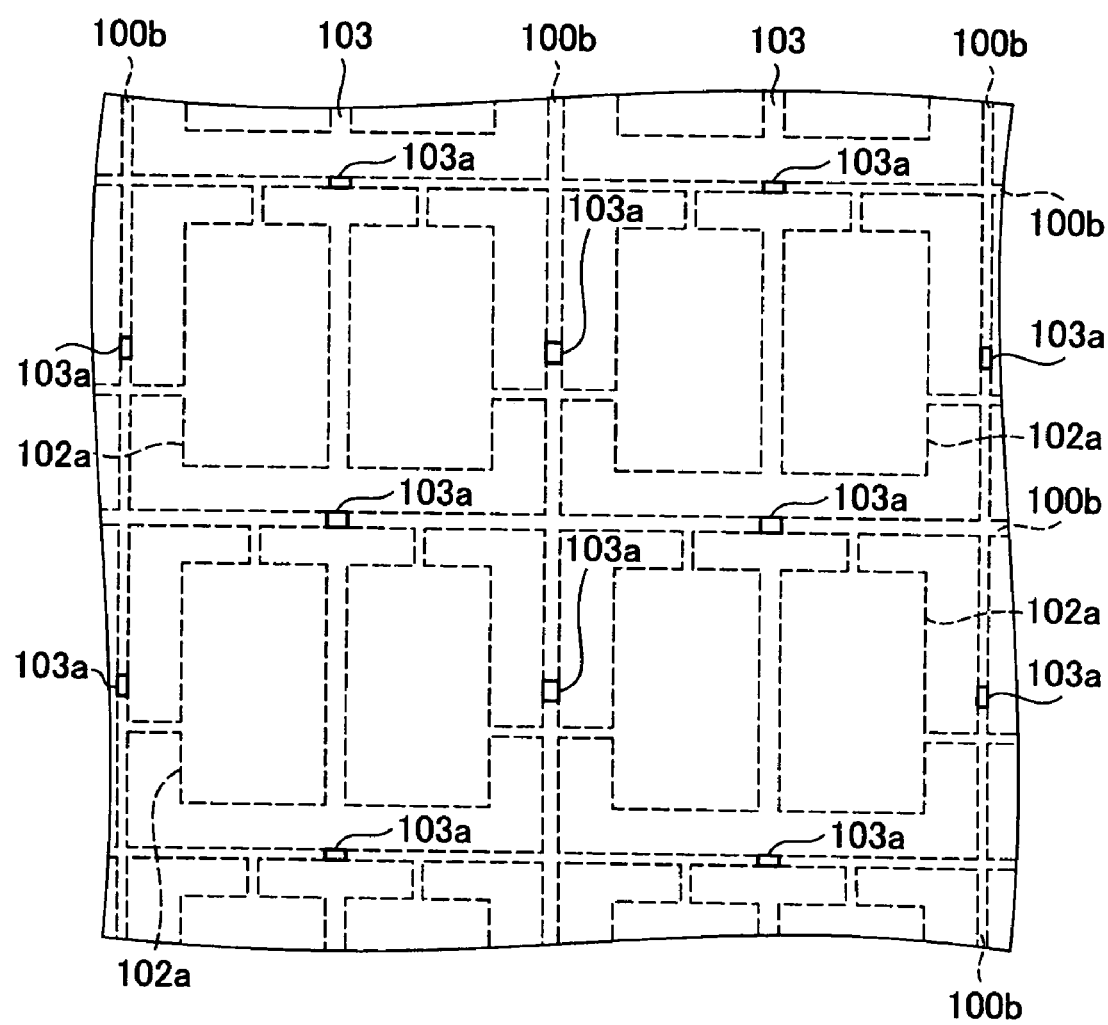
FIG. 7 is a schematic plan view showing a case in which a window portion 103a is formed discontinuously along a dicing region 100b.

In the foregoing embodiment, the windows 103a of the piezoelectric film 103 are formed continuously along the dicing regions 10b. Insofar as the electrode body portions 102a of the lower electrode 102 and the electrode body portions 104a of the upper electrode 104 are shorted, however, it is instead possible to form the windows 103a discontinuously along the dicing regions 100b as shown in FIG. 7.

Further, in the foregoing embodiment, all of the electrode body portions 102a of the lower electrodes 102 and all of the electrode body portions 104a of the upper electrodes 104 are mutually shorted. However, it is instead possible to divide the interior of the film bulk acoustic wave resonator wafer 100 into a number of areas and short the electrode body portions 102a and electrode body portions 104a area by area. Moreover, it is not necessary for all of the electrode body portions 102a and electrode body portions 104a to be connected to the shorting electrode portions 102b and 104b and the presence of electrode body portions 102a and 104a not connected to the shorting electrode portions 102b and 104b is acceptable.

Figure 8:
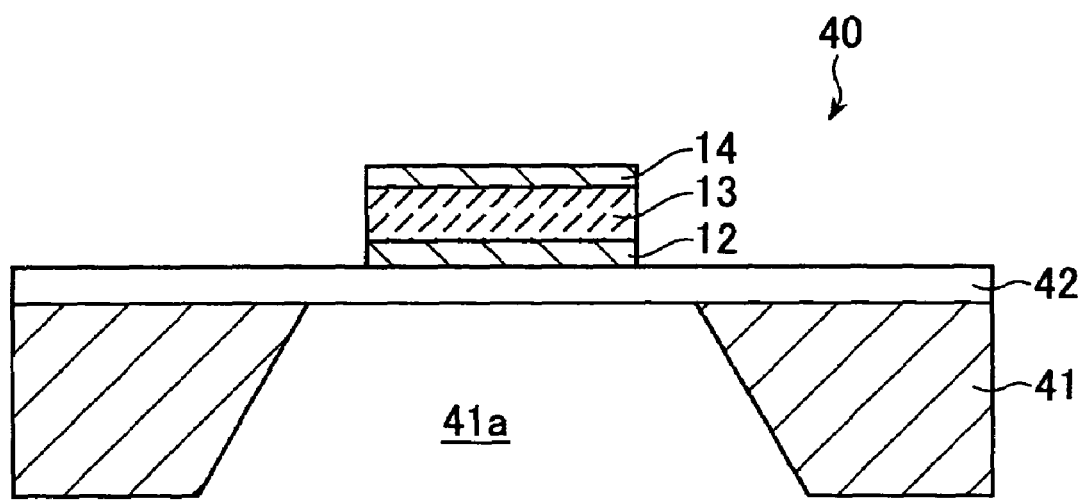
FIG. 8 is a schematic sectional view showing the structure of a film bulk acoustic wave resonator 40 having a diaphragm structure.

Furthermore, although the foregoing embodiment is formed between the substrate 101 and lower electrode 102 with the acoustic multilayer film 110, the present invention does not require formation of an acoustic multilayer film. Moreover, the film bulk acoustic wave resonator to which the present invention pertains is not limited to the type illustrated by the aforesaid embodiment. Specifically, the present invention can also be applied to a film bulk acoustic wave resonator having a diaphragm structure such as shown in FIG. 8. The film bulk acoustic wave resonator shown in FIG. 8 comprises a substrate 41 having a via hole 41a, a buffer layer 42 provided on the substrate 41, a lower electrode 12 provided on the buffer layer 42, a piezoelectric film 13 provided on the lower electrode 12, and an upper electrode 14 provided on the piezoelectric film 13. The buffer layer 42 serves as an etching stopper layer during etching of the via hole 41a. When the film bulk acoustic wave resonator of this structure is fabricated, the piezoelectric film 13 is formed with a window (not shown) and the lower electrode 12 and upper electrode 14 are shorted through the window, thereby preventing occurrence of electrical discharge in the course of fabrication.

What is claimed is:

1. A film bulk acoustic wave resonator wafer having a plurality of film bulk acoustic wave resonator forming regions, comprising:
   a substrate;
   a lower electrode and an upper electrode provided on the substrate; and a piezoelectric film provided between the lower electrode and upper electrode, wherein the lower electrode and upper electrode are shorted at least in a part of a region located between the film bulk acoustic wave resonator forming regions.

2. The film bulk acoustic wave resonator wafer as claimed in claim 1, wherein each of the lower electrode and upper electrode includes a shorting electrode portion surrounding the peripheries of the film bulk acoustic wave resonator forming regions, and the planar positions of at least a part of the shorting electrode portion of the lower electrode and at least a part of the shorting electrode portion of the upper electrode substantially coincide.

3. The film bulk acoustic wave resonator wafer as claimed in claim 2, wherein a window portion where the piezoelectric film is not present is continuously formed between the shorting electrode portion of the lower electrode and the shorting electrode portion of the upper electrode.

4. The film bulk acoustic wave resonator wafer as claimed in claim 3, further comprising an acoustic multilayer film provided between the substrate and lower electrode.

5. The film bulk acoustic wave resonator wafer as claimed in claim 2, wherein a window portion where the piezoelectric film is not present is discontinuously formed between the shorting electrode portion of the lower electrode and the shorting electrode portion of the upper electrode.

6. The film bulk acoustic wave resonator wafer as claimed in claim 5, further comprising an acoustic multilayer film provided between the substrate and lower electrode.

7. The film bulk acoustic wave resonator wafer as claimed in claim 2, further comprising an acoustic multilayer film provided between the substrate and lower electrode.

8. The film bulk acoustic wave resonator wafer as claimed in claim 1, further comprising an acoustic multilayer film provided between the substrate and lower electrode.

9. A method of fabricating a film bulk acoustic wave resonator, comprising:
   a first step of forming a lower electrode on a substrate;
   a second step of forming on the lower electrode a piezoelectric film having a window portion that exposes a part of the lower electrode;
   a third step of forming an upper electrode on the piezoelectric film so as to be shorted to the lower electrode through the window portion; and
   a fourth step of cutting the substrate along the window portion.

10. The method of fabricating a film bulk acoustic wave resonator as claimed in claim 9, wherein the piezoelectric film is formed while the portion to become the window portion is masked.

* * * * *

UNITED STATES PATENT AND TRADEMARK OFFICE
CERTIFICATE OF CORRECTION

PATENT NO. : 7,071,795 B2 Page 1 of 1
APPLICATION NO. : 10/980207
DATED : July 4, 2006
INVENTOR(S) : Kenji Inoue It is certified that error appears in the above-identified patent and that said Letters Patent is hereby corrected as shown below:

Column 9, line 4, replace "in a part of a" with -- a part of --.

Signed and Sealed this

Seventeenth Day of October, 2006

JON W. DUDAS
*Director of the United States Patent and Trademark Office*